United States Patent [19]
Adsett

[11] Patent Number: 5,371,753
[45] Date of Patent: Dec. 6, 1994

[54] LASER DIODE MOUNT

[75] Inventor: Anthony P. Adsett, Orlando, Fla.

[73] Assignee: Litton Systems, Inc., Beverly Hills, Calif.

[21] Appl. No.: 111,856

[22] Filed: Aug. 26, 1993

[51] Int. Cl.⁵ .............................................. H01S 3/045
[52] U.S. Cl. ...................................... 372/36; 257/718
[58] Field of Search ...................... 372/36, 34; 257/99, 257/718

[56] References Cited

U.S. PATENT DOCUMENTS

| | | | |
|---|---|---|---|
| 3,946,334 | 3/1976 | Yonezu et al. | 331/94.5 |
| 4,550,333 | 10/1985 | Ridder | 357/81 |
| 4,571,728 | 2/1986 | Yoshikawa | 372/36 |
| 4,689,659 | 8/1987 | Watanabe | 357/81 |
| 4,792,957 | 12/1988 | Kollanyi | 372/34 |
| 4,856,015 | 8/1989 | Matsui et al. | 372/50 |
| 4,901,324 | 2/1990 | Martin | 372/36 |
| 5,029,335 | 7/1991 | Fisher et al. | 372/36 |
| 5,107,330 | 4/1992 | Dahringer | 257/718 |
| 5,131,456 | 7/1992 | Wu | 257/718 |

FOREIGN PATENT DOCUMENTS

| | | | |
|---|---|---|---|
| 3342924 | 6/1985 | Germany | 257/718 |
| 63-226952 | 9/1988 | Japan | 257/718 |

Primary Examiner—James W. Davie
Attorney, Agent, or Firm—William M. Hobby, III

[57] ABSTRACT

A laser diode mount having a thermal coupling for a laser diode heat sink utilizes a shape memory alloy in the maintaining of laser diode arrays within an operational temperature bandwidth. A diode carrier member holds a laser diode array and is movably attached with posts to a heat sink and spaced by a variable air gap from the heat sink thermal pad. The diode carrier member can move on the posts to vary the gap and a shape memory alloy member is shaped as a coil or spring and coupled between the diode carrier member and the heat sink thermal pad for use in varying the gap therebetween. The shape memory alloy member works against a conventional spring. The heat sink thermal pad may be part of a forced convection heat sink. The shape memory alloy allows for a variable thermal impedance by the self-regulation of an air gap thickness between a laser diode array and the heat sink which allows a rapid warm-up of the diodes by providing thermal isolation from the heat sink during warm-up and then control of the heat transfer to the heat sink when the diodes reach their normal operating temperature.

14 Claims, 1 Drawing Sheet

LASER DIODE MOUNT

BACKGROUND OF THE INVENTION

The present invention relates to a laser diode mount having a thermal coupling for a laser diode heat sink using a shape memory alloy to obtain a variable thermal impedance by the regulation of the air gap thickness between the laser diodes and the heat sink.

Laser diode arrays provide greatly increased optical pumping efficiency and life compared with flash lamp pumping of lasers. However, the laser diode arrays provide a maximum pumping efficiency over a relatively narrow temperature band. This results in the need to heat up and then maintain the diodes within their operational temperature bandwidth. When the diodes are at their normal operational temperature, heat must be continuously dissipated into a forced air or forced liquid heat sink. In many laser systems, rapid operational capability of the laser is required and in addition many portable systems utilize batteries so that large amounts of power are not available to provide for the diode heating. If the complete diode head system and heat sinks are heated up, a large amount of power will be required because of the high thermal capacity of the heat and heat sink. Thus, a variable thermal impedance device which isolates the diodes from the head and heat sink during warm-up and then connects the diodes to the heat sink once an operational temperature is reached is a desirable goal.

In the past, various actuation methods have been available to provide a variable thermal impedance between diodes and a heat sink. These may be divided into two categories, active and passive. The active devices provide a variable thermal impedance using mechanisms driven by motors or solenoids and require extra power consumption in addition to adding weight, size and complexity to the system. Passive devices include the use of wax or fluid thermal expansion and bimetallic actuators. Wax and fluid filled actuators tend to have large thermal capacity and slow response times. Bimetallic devices can provide relatively large motions but, at the same time, provide relatively low force.

The present invention is for a variable thermal impedance device used in connection with a diode head system and heat sink which utilizes shape memory alloys which are alloys that undergo a reversible martensite-austenite crystal phase transformation below a certain transformation temperature which determined by the alloy composition. The shape memory alloy is martensitic, weak, and very easily deformed to enlarge strain level without permanent damage. When the material is heated to an austenite phase above the transformation temperature, deformation goes away and the material returns to the original shape. The austenite-phase material can be up to ten times stronger than its martensitic counterpart. A shape memory alloy, such as a nickel titanium alloy, can be used for this purpose.

Prior U.S. patents which show various ways of maintaining a temperature bandwidth or cooling laser diode arrays can be seen in U.S. Pat. No. 4,792,957 to Kollanyi for a laser temperature controller which uses a bridge circuit connected with a thermistor device in an active temperature controller. In the U.S. Pat. No. 4,550,333 to Ridder et al., a light emitting semiconductor mount includes a metal heat sink support having a top surface positioned into three steps with the semiconductor mounted to the central step and a dielectric block mounted to the lower step. An electrical coupling means couples the semiconductor to the lower step. In the Yoshikawa U.S. Pat. No. 4,571,728, a temperature controlled device for a semiconductor laser has a temperature sensitive resistor for detecting the temperature of a semiconductor laser and a Peltier element connected to the semiconductor laser and controlled with regard to the direction of the heat transmission in accordance with the resistance value of the temperature sensitive resistor. In the U.S. Pat. No. 4,856,015 to Matsui, et al., a semiconductor laser array device that allows temperature distribution on the light emitting area is shown. In the Watanabe U.S. Pat. No. 4,689,659, a temperature controller for a semiconductor device is electronically controlled and is responsive to an output signal from a temperature sensor to control the temperature of the semiconductor device so as to be substantially constant and uses a temperature sensor to detect the temperature of a semiconductor device for producing the signal while controlling the temperature. In the Yonezu et al. U.S. Pat. No. 3,946,334, an injection semiconductor laser device includes an ohmic metal film on the side of the heat sink near the active region and is plated with a layer of thermally conducted material to protect the laser from being damaged when the laser device is bonded to the heat sink. The Fisher et al. U.S. Pat. No. 5,029,335, is for a heat dissipating device for laser diodes for dissipating waste heat produced by the solid state device and includes a base member in thermal contact with a solid state device and a plurality of elongated heat conducting elements extending outwardly from the base member. In the Martin U.S. Pat. No. 4,901,324, a heat transfer device for cooling and transferring heat from a laser diode device and associated heat generating elements is provided and includes an elongated closed ended heat pipe having one portion in a closely spaced proximity and in heat conductive relationship to the laser medium and a second remote end portion in a heat conducting relationship to a heat sink. A heat transfer fluid can move through the heat pipe to remote locations for conduction of the heat therein into the heat sink.

The present invention is for a passive thermal actuator using a shape memory alloy to obtain a variable thermal impedance by the regulation of an air gap thickness between a laser diode array and a heat sink. The device permits rapid warm-up of the diodes by providing thermal isolations from the heat sink during the warm-up and then control of the heat transfer to the heat sink when the diodes reach their normal operating temperature. The power required to bring the diodes up to operating temperatures is thus greatly reduced, resulting in a lowering of a system power requirements and weight.

SUMMARY OF THE INVENTION

A laser diode mount having a thermal coupling for a laser diode heat sink utilizes a shape memory alloy in the maintaining of laser diode arrays within an operational temperature bandwidth. A diode carrier member holds a laser diode array and is movably attached with posts to a heat sink and spaced by a variable air gap from the heat sink thermal pad. The diode carrier member can move on the posts to vary the gap and a shape memory alloy member is shaped as a coil or spring and coupled between the diode carrier member and the heat sink thermal pad for use in varying the gap therebetween. The shape memory alloy member works against a conventional spring. The heat sink thermal pad may be part of a forced convection heat sink. The shape memory alloy allows for a variable thermal impedance by the self-regulation of an air gap thickness between a laser diode array and the heat sink which allows a rapid warm-up of the diodes by providing thermal isolation from the heat sink during warm-up and then control of the heat transfer to the heat sink when the diodes reach their normal operating temperature.

DESCRIPTION OF THE PREFERRED EMBODIMENT

Figure 1:
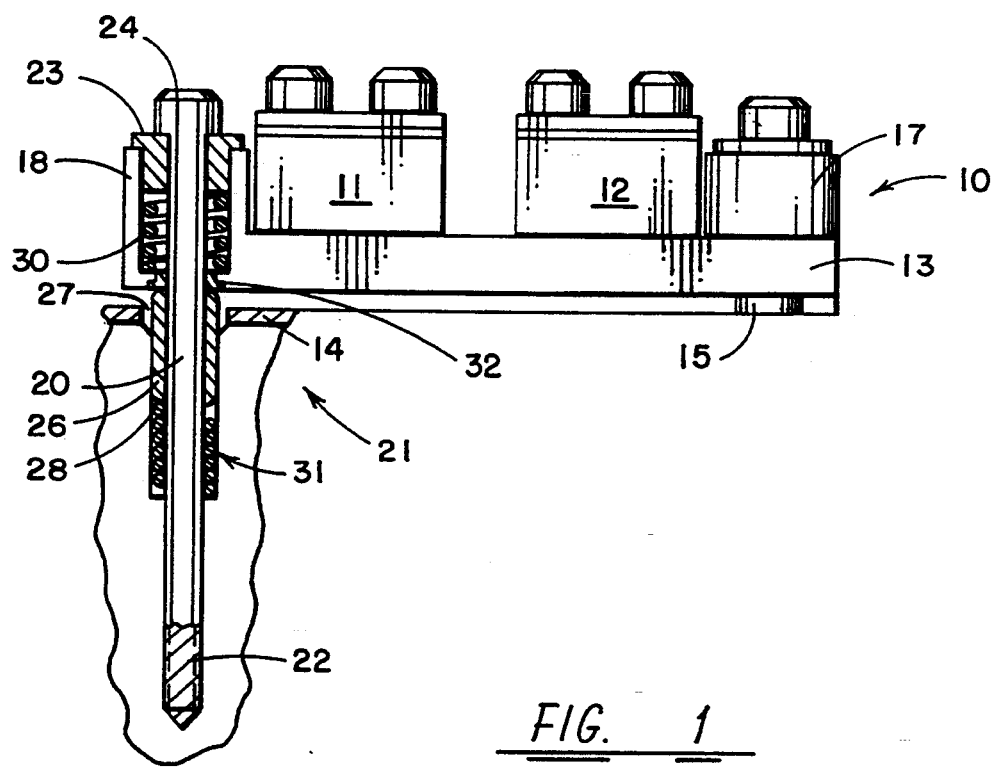
Figure 2:
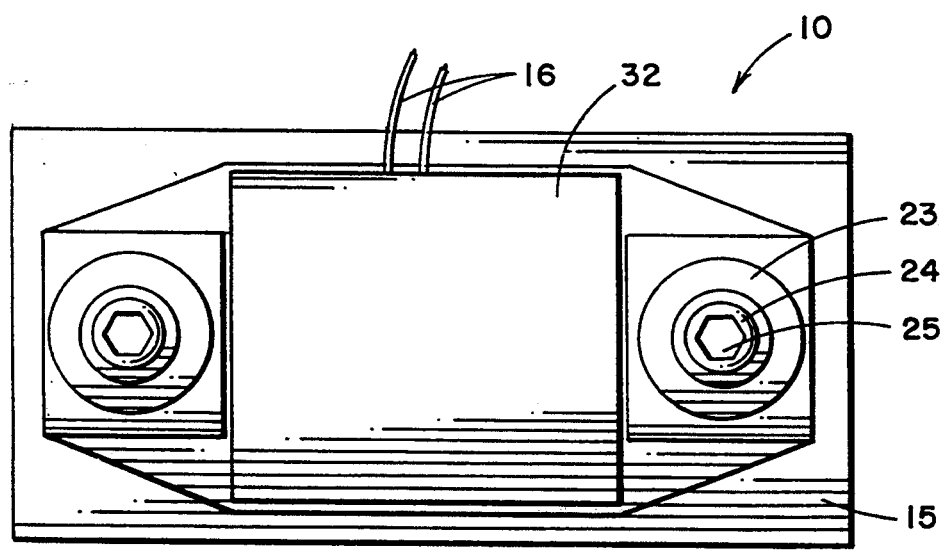

Referring to the drawings FIGS. 1 and 2, a laser diode mount and laser diode heat sink along with a thermal coupling is illustrated generally at 10 having a pair of laser diode arrays 11 and 12 mounted to a diode carrier member 13 which may include a built-in electric heater powered through the conductors 16 of FIG. 2 for heating the diode arrays 11 and 12 up to operating temperature. A heat sink thermal pad 14 is mounted parallel to and spaced from the diode carrier member 13 by gap 15. The heat sink thermal pad 14 is part of a heat sink for removing heat from the diode carrier pad 13 as generated by the diode arrays 11 and 12 and may be hollow therebeneath for a fluid to pass for removing heat passing through the conductive surface of the heat sink thermal pad 14. The carrier plate 13 may be an aluminum plate having the diode arrays attached thereto and having two (or more) cylindrical portions 17 and 18 on each end of the carrier plate 13. A stainless steel pin or post 20 is attached through each sleeve 17 and 18 to the heat sink 21 with a threaded attachment 22. Each post 20 is supported in polymer bushings 23 and 32, such as a Delrin AF bushing, having a lip for fitting into the sleeve 18 and then having the post 20 inserted therethrough. The post 20 has a head 24 which contacts against the sleeve 23. The head 24 has a hex opening 25 in the top thereof for attaching and removing the post 20 to and from the heat sink 21. A polymer bushing 26 may also be made of a Delrin AF material and fits within an opening 27 within the heat sink 21 and protrudes through the heat sink thermal pad 14. The polymer sleeve 26 is slidably mounted on post 20 and protrudes into the countersunk bore portion 28 and may have a stainless steel coiled compression spring 31 placed around the post 20 and within the countersunk portion 28 below the sleeve 26 to compress the sleeve 26 in an upward direction. The polymer sleeves or bushings 23 and 26 serve to insulate the carrier plate 13 from each of the posts 20 and also provide a long life bearing support. Within the cylindrical sections 17 and 18 of the carrier plate 13 is housed a coil or helical spring 30 fabricated from a shape memory alloy, such as a nickel-titanium alloy, which works against the opposing bias spring 31 on the opposite side of the sleeve 26. The category of materials known as shape memory alloys are generally ones that undergo a reversible martensite-austenite crystal phase transformation. Below a certain transformation temperature, which is determined by the alloy composition, the shape memory alloy is martensitic, weak, and very easily deformed to large strain level without permanent damage. When the material is heated to the austenite-phase above the transformation temperature, the deformation goes away and the material returns to the original shape, doing considerable work in the process. The austenite-phase material can be up to ten times stronger than its martensitic counterpart. The shape memory alloy of the present spring design can be a TINEL Alloy K which is a nickel-titanium alloy made by Raychem Corporation, 300 Constitution Drive, Menol Park, Calif. 94025, suited for cyclic use in an actuator application. This alloy has a low martensitic yield stress (plateau stress) which allows low reset forces for shape memory strains up to four percent and a narrow hysteresis.

In operation, at temperatures below the phase transformation temperature, the shape memory alloy spring 30 is in martensite and has a very low spring constant. Under these conditions, the stainless steel spring 31 in the heat sink is able to displace the diode carrier plate 13 away from the heat sink 14. When the temperature of the carrier plate 13 reaches the phase transformation temperature, the shape memory alloy spring 30 changes to austenite, becoming high modulus and increasing in spring rate by a factor of ten. The shape memory alloy spring 30 then overpowers the stainless steel spring 31 and forces the diode carrier plate 13 against the heat transfer pad 14 on the heat sink 21. The temperature of the carrier plate 13 will then drop causing a partial austenite-martensite condition in the shape memory alloy spring 30 and a slight motion away from the heat sink 21. A small air gap is then established between the diode carrier plate 13 and the pad 14 on the heat sink 21. At this point, the system becomes "closed loop" with the magnitude of the air gap 15 being self-adjusted by the shape memory alloy spring 30 so as to always maintain the carrier plate 13 and the temperature in the diodes 11 and 12 within the shape memory alloy phase transformation temperature bandwidth.

An electric heater 32 supplied from the conductors 16 leading from a battery or other electrical power source allows for a rapid warm-up of the diode arrays 11 and 12 with a minimum power input and the diode mounting then provides the maximum efficiency over a relative narrow temperature band that results in maintaining the diodes within their operational temperature bandwidth and continuously dissipates varying amounts of heat depending on the temperature of the shape memory alloy 30 changing the air gap 15 between direct contact between the diode carrier plate 13 and the heat sink pad 14 and various spacings of the gap. Thus, a passive thermal actuator using the shape memory effect metal obtains a variable thermal impedance by self-regulation of the air gap 15 thickness between the laser diode arrays 11 and 12 and the supporting carrier 13 spaced from the heat sink plate 14. The diodes 11 and 12 are rapidly warmed up by providing thermal isolation from the heat sink during warm-up and in the use of a heater for the initial heat up, if desired, and then control of the heat transfer to the heat sink when the diodes 11 and 12 reach their normal operating temperature. As a result, the power required to bring the diodes 11 and 12 up to operational temperature is greatly reduced resulting in a lowering of system power requirements and weight. The heater power is no longer required once the diodes are heated up to temperature. The heat dissipation of the diodes is then sufficient to maintain their temperature in the required phase-transformation region of the shape-alloy material.

It should be clear at this time that a laser diode mount having a passive thermal actuator has been provided which obtains variable thermal impedance by self-regulation of an air gap thickness using a shape memory alloy. However, the present invention is not to be considered limited to the forms shown which are to be considered illustrative rather than restrictive.

I claim:

1. A laser diode mount having a thermal coupling for a laser diode heat sink comprising:
   a diode carrier member having two end portions;
   a heat sink thermal pad spaced from said carrier member by a predetermined variable gap and having said diode carrier member attached thereto;
   at least one shape memory alloy member coupled between the one end of said carrier member and said heat sink thermal pad to vary a portion of the gap between said heat sink thermal pad and said carrier member responsive to variations in the temperature change of said shape memory alloy member whereby said laser diode can be heated to a predetermined temperature range and maintained within the range during operation of the diode.

2. A laser diode mount having a thermal coupling for a laser diode heat sink in accordance with claim 1 in which a shape memory alloy member is coupled between the each end of said carrier member and said heat sink thermal pad to vary a portion of the gap between said heat sink thermal pad and diode carrier member.

3. A laser diode mount having a thermal coupling for a laser diode heat sink in accordance with claim 1 in which said shape memory alloy member is a coil made of a shape memory alloy.

4. A laser diode mount having a thermal coupling for a laser diode heat sink in accordance with claim 1 in which a metal post extends through a bore in said diode carrier member and is removably attached to said heat sink thermal pad.

5. A laser diode mount having a thermal coupling for a laser diode heat sink in accordance with claim 4 in which said heat sink thermal pad has a bore therein and a polymer sleeve mounted in said bore and said metal post extends through said polymer sleeve around said post to thereby insulate said metal post from said heat sink thermal pad.

6. A laser diode mount having a thermal coupling for a laser diode heat sink in accordance with claim 5 in which said diode carrier member has a bore therethrough having a polymer sleeve mounted therein around said post passing therethrough.

7. A laser diode mount having a thermal coupling for a laser diode heat sink in accordance with claim 2 in which each said shape memory alloy coils surrounds one said post and is supported between said polymer sleeve mounted in said diode carrier member and said polymer sleeve mounted in said heat sink pad.

8. A laser diode mount having a thermal coupling for a laser diode heat sink in accordance with claim 7 in which said polymer sleeve mounted in said diode carrier is made with an acetal resin polymer.

9. A laser diode mount having a thermal coupling for a laser diode heat sink in accordance with claim 8 in which said polymer sleeve mounted in said heat sink pad is made with an acetal resin polymer.

10. A laser diode mount having a thermal coupling for a laser diode heat sink in accordance with claim 5 in which a metal spring is mounted between said polymer sleeve mounted in each said heat sink pad and said heat sink pad.

11. A laser diode mount having a thermal coupling for a laser diode heat sink in accordance with claim 10 in which each said shape memory alloy member is mounted between said polymer sleeve mounted in said heat sink pad and said polymer sleeve in said diode carrier member bore.

12. A laser diode mount having a thermal coupling for a laser diode heat sink in accordance with claim 1 in which said shape memory alloy is a nickel titanium alloy.

13. A laser diode mount having a thermal coupling for a laser diode heat sink in accordance with claim 3 in which said shape memory alloy coil is compression spring of shape memory alloy.

14. A laser diode mount having a thermal coupling for a laser diode heat sink in accordance with claim 1 in which said diode mount member has an electric heater mounted adjacent at least one laser diode mounted to said diode mount member.

* * * * *